(12) United States Patent
Hichri

(10) Patent No.: US 12,185,477 B2
(45) Date of Patent: Dec. 31, 2024

(54) METHOD FOR MAKING PRINTED WIRING BOARD, PRINTED WIRING BOARD, AND ADHESIVE FILM FOR MAKING PRINTED WIRING BOARD

(71) Applicant: AJINOMOTO CO., INC., Tokyo (JP)

(72) Inventor: Habib Hichri, Cupertino, CA (US)

(73) Assignee: AJINOMOTO CO., INC., Tokyo (JP)

( * ) Notice: Subject to any disclaimer, the term of this patent is extended or adjusted under 35 U.S.C. 154(b) by 0 days.

(21) Appl. No.: 17/684,620

(22) Filed: Mar. 2, 2022

(65) Prior Publication Data

US 2022/0304163 A1 Sep. 22, 2022

Related U.S. Application Data

(60) Provisional application No. 63/163,447, filed on Mar. 19, 2021.

(51) Int. Cl.
*C23C 14/34* (2006.01)
*H05K 3/06* (2006.01)
*H05K 3/40* (2006.01)

(52) U.S. Cl.
CPC .......... *H05K 3/4038* (2013.01); *C23C 14/34* (2013.01); *H05K 3/06* (2013.01); *H05K 2203/06* (2013.01); *H05K 2203/092* (2013.01)

(58) Field of Classification Search
None
See application file for complete search history.

(56) References Cited

U.S. PATENT DOCUMENTS

| 5,561,085 | A | * | 10/1996 | Gorowitz | H01L 23/5221 |
| | | | | | 438/126 |
| 6,333,560 | B1 | * | 12/2001 | Uzoh | H01L 23/53238 |
| | | | | | 257/E21.585 |
| 2010/0044078 | A1 | * | 2/2010 | Narahashi | B32B 37/025 |
| | | | | | 156/247 |
| 2017/0110363 | A1 | * | 4/2017 | Aoyama | C11D 3/3947 |
| 2019/0273043 | A1 | * | 9/2019 | Song | H01L 21/3212 |

* cited by examiner

*Primary Examiner* — Shamim Ahmed
*Assistant Examiner* — Bradford M Gates
(74) *Attorney, Agent, or Firm* — Oblon, McClelland, Maier & Neustadt, L.L.P.

(57) ABSTRACT

By interposing a hard mask between a dielectric and photosensitive material it is possible to form fine via in the dielectric by dry etching without damaging the remaining surface of the dielectric.

24 Claims, 1 Drawing Sheet

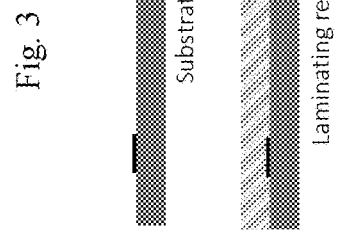
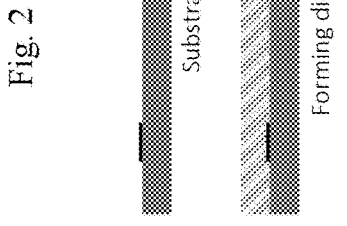
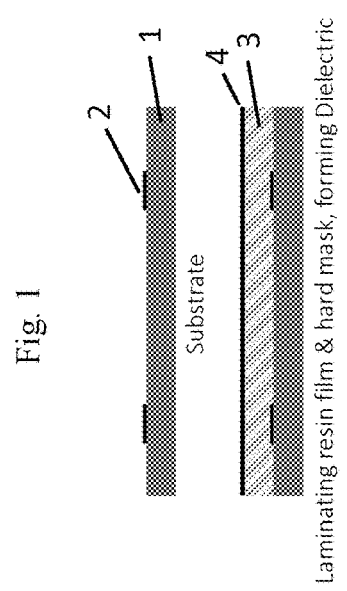
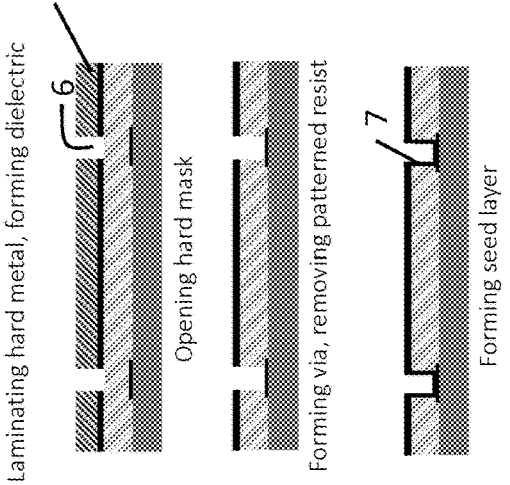
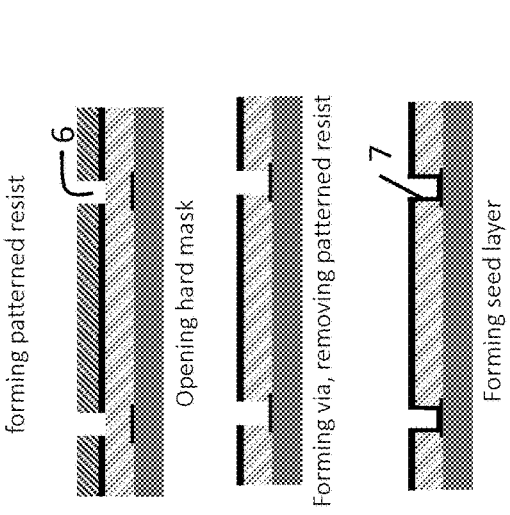

METHOD FOR MAKING PRINTED WIRING BOARD, PRINTED WIRING BOARD, AND ADHESIVE FILM FOR MAKING PRINTED WIRING BOARD

CROSS REFERENCES TO RELATED APPLICATIONS

This application claims priority to U.S. Provisional Patent Application No. 63/163,447, filed on Mar. 19, 2021, which is incorporated herein by reference in its entirety.

BACKGROUND OF THE INVENTION

Field of the Invention

The present invention relates to methods for making printed wiring boards and printed wiring boards produced by such a method. The present invention also relates to adhesive sheets useful for making printed wiring boards.

Discussion of the Background

Printed wiring boards are widely used for various electronic instruments and are required to have thin layers and fine wiring circuits to achieve downsizing and high functionalization of electronic instruments. As a technique of producing a printed wiring board, there is known a production method which uses a build-up process of alternately layering an insulating layer and a conductive layer on an internal layer circuit substrate.

In the production method using the build-up process, an insulating layer is formed, for example, by laminating a resin composition layer on an internal layer circuit substrate with an adhesive film having a resin composition layer and thermally curing the resin composition layer. Subsequently, the formed insulating layer is perforated to form via holes, and subjected to desmear treatment to simultaneously perform removal of a resin residue (smear) inside the via hole and roughening of the surface of the insulating layer (see, e.g., US 2010/0044078 and U.S. Pat. No. 9,516,756, both of which are incorporated herein by reference in their entireties).

Currently the main process to fabricate a via hole in the insulating material, also referred to as dielectric, involves using a UV or $CO_2$ laser process. However, the semiconductor packaging industry trend is driving to smaller features and especially small via holes, and UV and $CO_2$ lasers are reaching their limitation (~15 μm by UV laser and >20 μm size via critical dimension using $CO_2$). The industry trend is pushing for even finer patterning with via holes having <10 μm critical dimension size.

By using Reactive Ion Etch ("RIE") it could be possible to achieve the critical dimension of via holes of <10 μm (down to sub-micron size). Using RIE will, however, would involve the use of lithography process to define first the initial size of the via in a photo resist material. This patterning process would use either standard lithography equipment or mask-less equipment known also as the Laser direct Imaging ("LDI"). This process would also involve a photo-sensitive material to pattern in it the via holes. Using the RIE after the resist exposure would, however, result in full erosion of the resist before transferring the via pattern into the dielectric.

Thus, there remains a need for a process for producing printed wiring boards having via holes with <10 μm dimension size.

SUMMARY OF THE INVENTION

Accordingly, it is one object of the present invention to provide novel methods for producing printed a wiring board.

It is another object of the present invention to provide novel methods for producing printed a wiring board having via holes with <10 μm dimension size.

It is another object of the present invention to provide novel printed wiring boards produced by such a method.

It is another object of the present invention to provide novel adhesive sheets useful for producing a printed wiring board.

These and other objects, which will become apparent during the following detailed description, have been achieved by the inventor's discovery that providing a hard mask on the dielectric prior to coating or laminating the photo-sensitive material on the surface of the dielectric allows use of RIE while protecting the surface of the dielectric from being exposed to RIE ion bombardment during the full etch process and transfer of the via pattern into the dielectric. Therefore, after the pattern transfer of the via into the dielectric and stripping the remaining layer of the resist and nitride hard mask, the top surface of the dielectric will be fully intact and undamaged.

Thus, in a first embodiment, the present invention provides:

(1) A method of producing a circuit board, comprising:
  (a) laminating an adhesive film, which comprises a resin film and a hard mask, on a substrate such that said resin film is in contact with said substrate, and curing said adhesive film to obtain a dielectric;
  (b) coating or laminating a photo-sensitive material on said hard mask and developing said photo-sensitive material, to form a pattern of one or more via;
  (c) forming one or more openings in said hard mask corresponding to said one or more via in said photo-sensitive material with dry etching; and
  (d) forming one or more via in said dielectric corresponding to said one or more via in said photosensitive material by dry etching;
  wherein the hard mask comprises a metal nitride.

(2) The method according (1), wherein said hard mask comprises at least one metal nitride selected from the group consisting of TiN, TaN, $Si_3N_4$, $W_3N_2$, Cu3N, AlN (aluminum nitride), BN (boron nitride) and mixtures thereof.

(3) The method according to (1) or (2), wherein said hard mask has a thickness of 10 nm to 5 μm.

(4) The method according to (1) or (2), wherein said hard mask has a thickness of 10 nm to 3 μm.

(5) The method according to (1) or (2), wherein said hard mask has a thickness of 10 nm to 1 μm.

(6) The method according to any of (1) to (5), wherein said dry etching of (d) process is carried out by RIE.

(7) The method according to any of (1) to (6), further comprising:
  (e) removing said photo-sensitive material.

(8) The method according to any of (1) to (7), further comprising:
  (f) sputtering a seed layer.

In a second embodiment, the present invention provides:

(9) A method of producing a circuit board, comprising:
  (a) laminating an adhesive film, which comprises a resin, on a substrate, curing said resin to form a dielectric, and sputtering a hard mask on said dielectric;
  (b) coating or laminating a photo-sensitive material on said hard mask and developing said photo-sensitive material, to form a pattern of one or more via;

(c) forming one or more openings in said hard mask corresponding to said one or more via in said photo-sensitive material with dry etching;

(d) forming one or more via in said dielectric corresponding to said one or more via in said photo-sensitive material with dry etching;

wherein the hard mask comprises a metal nitride.

(10) The method according (9), wherein said hard mask comprises at least one metal nitride selected from the group consisting of TiN, TaN, $Si_3N_4$, $W_3N_2$, Cu3N, AlN (aluminum nitride), BN (boron nitride) and mixtures thereof.

(11) The method according to (9) or (10), wherein said hard mask has a thickness of 10 nm to 5 μm.

(12) The method according to (9) or (10), wherein said hard mask has a thickness of 10 nm to 3 μm.

(13) The method according to (9) or (10), wherein said hard mask has a thickness of 10 nm to 1 um.

(14) The method according to any of (9) to (13), wherein said dry etching of (d) process is carried out by RIE.

(15) The method according to any of (9) to (14), further comprising:

(e) removing said photo-sensitive material.

(16) The method according to any of (9) to (15), further comprising:

(f) sputtering a seed layer.

In a third embodiment, the present invention provides:

(17) A method of producing a circuit board, comprising:

(a) laminating an adhesive film, comprising a resin, on a substrate, laminating a hard mask on said adhesive film, and curing said resin to obtain a dielectric;

(b) coating or laminating a photo-sensitive material on said hard mask and developing said photo-sensitive material, to form a pattern of one or more via;

(c) forming one or more openings in said hard mask corresponding to said one or more via in said photo-sensitive material with dry etching;

(d) forming one or more via in said dielectric corresponding to said one or more via in said photo-sensitive material with dry etching;

wherein the hard mask comprises a metal nitride.

(18) The method according (17), wherein said hard mask comprises at least one metal nitride selected from the group consisting of TiN, TaN, $Si_3N_4$, $W_3N_2$, Cu3N, AlN (aluminum nitride), BN (boron nitride) and mixtures thereof.

(19) The method according to (17) or (18), wherein said hard mask has a thickness of 10 nm to 5 μm.

(20) The method according to (17) or (18), wherein said hard mask has a thickness of 10 nm to 3 μm.

(21) The method according to (17) or (18), wherein said hard mask has a thickness of 10 nm to 1 um.

(22) The method according to any of (17) to (21), wherein said dry etching of (d) process is carried out by RIE.

(23) The method according to any of (17) to (22), further comprising:

(e) removing said photo-sensitive material.

(24) The method according to any of (17) to (23), further comprising:

(f) sputtering a seed layer.

In a fourth embodiment, the present invention provides:

(25) An adhesive film, comprising a cover film, a resin composition layer, and a hard mask in this order;

wherein said hard mask comprises a metal nitride.

(26) The adhesive film according to (25), wherein said hard mask comprises at least one metal nitride selected from the group consisting of TiN, TaN, $Si_3N_4$, $W_3N_2$, Cu3N, AlN (aluminum nitride), BN (boron nitride) and mixtures thereof.

(27) The adhesive film according to (25) or (26), wherein said hard mask has a thickness of 10 nm to 5 μm.

(28) The adhesive film according to (25) or (26), wherein said hard mask has a thickness of 10 nm to 3 μm

(29) The adhesive film according to (25) or (26), wherein said hard mask has a thickness of 10 nm to 1 μm.

BRIEF DESCRIPTION OF THE DRAWING

A more complete appreciation of the invention and many of the attendant advantages thereof will be readily obtained as the same become better understood by reference to the following detailed description when considered in connection with the accompanying drawings, wherein:

FIG. 1 schematically depicts a first second embodiment of the present invention.

FIG. 2 schematically depicts a second embodiment of the present invention,

FIG. 3 schematically depicts a third embodiment of the present invention.

In FIGS. 1, 2, and 3, the reference numerals have the following meanings:

1, substrate
2, patterned conductive layer
3, dielectric
4, hard mask
5, photo-sensitive material
6, via
7, seed layer

DETAILED DESCRIPTION OF THE PREFERRED EMBODIMENTS

Thus, in a first embodiment, the present invention a method of producing a circuit board, comprising:

(a) laminating an adhesive film, which comprises a resin film and a hard mask, on a substrate such that said resin film is in contact with said substrate, and curing said adhesive film to obtain a dielectric;

(b) coating or laminating a photo-sensitive material on said hard mask and developing said photo-sensitive material, to form a pattern of one or more via;

(c) forming one or more openings in said hard mask corresponding to said one or more via in said photo-sensitive material with dry etching; and (d) forming one or more via in said dielectric corresponding to said one or more via in said photo-sensitive material by dry etching;

wherein the hard mask comprises a metal nitride.

The various components and steps used in this method will be discussed below.

Substrate

The term "substrate" as used in the present invention refers to an "internal layer circuit substrate" which is an intermediate product that has a patterned conductive layer (circuit) on one or both surfaces of a substrate such as a glass epoxy substrate, a metal substrate, a polyester substrate, a polyimide substrate, a BT resin substrate and a thermosetting polyphenylene ether substrate, wafer substrate, panel substrate, and that an insulating layer and a conductive layer are further to be formed thereon in the production of a printed wiring board.

Adhesive Film

The term "adhesive film" refers to a film which contains a resin film or layer, which can be cured to for a dielectric. In this embodiment, the adhesive film also contains a hard mask on one side of the resin film or layer. The adhesive film may further contain a cover or protective sheet on the side of the resin film or layer opposite the hard mask.

Resin Film

The resin composition used for the resin film or resin composition layer is not particularly limited as long as a cured product thereof may have sufficient hardness and insulation properties. For example, a resin composition containing (a) an epoxy resin, (b) a curing agent, and (c) an inorganic filler can be used. The resin composition used for the resin composition layer may further contain an additive such as a thermoplastic resin, an accelerator, a flame retardant, and a rubber particle, if necessary.

In the present invention, the content of each component constituting the resin composition is a value when the total content of nonvolatile components in the resin composition is defined as 100% by mass.

(a) Epoxy Resin.

Examples of the epoxy resin may include a bisphenol A type epoxy resin, a bisphenol F type epoxy resin, a bisphenol S type epoxy resin, a bisphenol AF type epoxy resin, a dicyclopentadiene type epoxy resin, a trisphenol type epoxy resin, a naphthol novolac type epoxy resin, a phenol novolac type epoxy resin, a tert-butyl-catechol type epoxy resin, a naphthalene type epoxy resin, a naphthol type epoxy resin, an anthracene type epoxy resin, a glycidyl amine type epoxy resin, a glycidyl ester type epoxy resin, a cresol novolac type epoxy resin, a biphenyl type epoxy resin, a linear aliphatic epoxy resin, an epoxy resin having a butadiene structure, an alicyclic epoxy resin, a heterocyclic epoxy resin, a Spiro ring-containing epoxy resin, a cyclohexane dimethanol type epoxy resin, a naphthylene ether type epoxy resin, and a trimethylol type epoxy resin. The epoxy resin may be used alone or in combination of two or more kinds thereof.

The epoxy resin preferably contains an epoxy resin having two or more epoxy groups within the molecule. It is preferable that at least 50% by mass of the epoxy resin is an epoxy resin having two or more epoxy groups within the molecule when a content of nonvolatile components in the epoxy resin is defined as 100% by mass. In particular, it is preferable that the epoxy resin contains an epoxy resin that has two or more epoxy groups within the molecule and is liquid at a temperature of 20° C. (hereinafter referred to as "liquid epoxy resin") and an epoxy resin that has three or more epoxy groups within the molecule and is solid at a temperature of 20° C. (hereinafter referred to as "solid epoxy resin"). When a liquid epoxy resin and a solid epoxy resin are used in combination as the epoxy resin, a resin composition having excellent flexibility can be obtained. Further, the rupture strength of the cured product of the resin composition is improved.

As the liquid epoxy resin, a bisphenol A type epoxy resin, a bisphenol F type epoxy resin, a phenol novolac type epoxy resin, or a naphthalene type epoxy resin is preferable, and a naphthalene type epoxy resin is more preferable. Specific examples of the liquid epoxy resin may include "EXA4032SS" (naphthalene type epoxy resin), "HP4032" (naphthalene type epoxy resin), and "HP4032D" (naphthalene type epoxy resin) which are available from DIC Corporation, "jER828EL" (bisphenol A type epoxy resin), "jER807" (bisphenol F type epoxy resin), and "jER152" (phenol novolac type epoxy resin) which are available from Mitsubishi Chemical Corporation, and "ZX1059" (mixed product of a bisphenol A type epoxy resin and a bisphenol F type epoxy resin) available from Nippon Steel Chemical Co., Ltd. These may be used alone or in combination of two or more kinds thereof.

As the solid epoxy resin, a tetrafunctional naphthalene type epoxy resin, a cresol novolac type epoxy resin, a dicyclopentadiene type epoxy resin, a trisphenol type epoxy resin, a naphthol novolac type epoxy resin, a biphenyl type epoxy resin, or a naphthylene ether type epoxy resin is preferable, and a tetrafunctional naphthalene type epoxy resin, a biphenyl type epoxy resin, or a naphthylene ether type epoxy resin is more preferable. Specific examples of the solid epoxy resin may include "HP-4700" (tetrafunctional naphthalene type epoxy resin), "N-690" (cresol novolac type epoxy resin), "N-695" (cresol novolac type epoxy resin), "HP-7200" (dicyclopentadiene type epoxy resin), "EXA7311" (naphthylene ether type epoxy resin), "EXA7310" (naphthylene ether type epoxy resin), and "EXA7311-G3" (naphthylene ether type epoxy resin) which are available from DIC Corporation, "EPPN-502H" (trisphenol type epoxy resin), "NC7000L" (naphthol novolac type epoxy resin), "NC3000H" (biphenyl type epoxy resin), "NC3000" (biphenyl type epoxy resin), "NC3000L" (biphenyl type epoxy resin), and "NC3100" (biphenyl type epoxy resin) which are available from NIPPON KAYAKU Co., Ltd., "ESN475" (naphthol novolac type epoxy resin) and "ESN485" (naphthol novolac type epoxy resin) which are available from Tohto Kasei Co., Ltd., "ESN475V" (naphthol novolac type epoxy resin) available from Nippon Steel Chemical Co., Ltd., and "YX4000H" (biphenyl type epoxy resin) and "YX4000HK" (bixylenol type epoxy resin) which are available from Mitsubishi Chemical Corporation.

When the liquid epoxy resin and the solid epoxy resin are used in combination as the epoxy resin, a mass ratio thereof (liquid epoxy resin:solid epoxy resin) is preferably within a range of 1:0.1 to 1:5. When the mass ratio of the liquid epoxy resin to the solid epoxy resin falls within such a range, there may be obtained the following effects: i) moderate adhering properties can be obtained when the resin composition is used in a resin layer form; ii) sufficient flexibility, which results in improvement in handleability, can be obtained when the resin composition is used in a resin layer form; iii) a cured product having sufficient rupture strength can be obtained, and the like. From the viewpoints of the effects i) to iii) as noted above, the mass ratio of the liquid epoxy resin to the solid epoxy resin (liquid epoxy resin:solid epoxy resin) is more preferably within a range of 1:0.3 to 1:4.5, and still more preferably within a range of 1:0.6 to 1:4.

The content of the epoxy resin in the resin composition is preferably 3% by mass to 35% by mass, more preferably 5% by mass to 30% by mass, still more preferably 5% by mass to 25% by mass, and particularly preferably 7% by mass to 20% by mass.

(b) Curing Agent.

The curing agent is not particularly limited as long as it has a function of curing an epoxy resin. Examples thereof may include a phenol-based curing agent, a naphthol-based curing agent, an active ester-based curing agent, a benzoxazine-based curing agent, and a cyanate ester-based curing agent. The curing agent may be used alone or in combination of two or more kinds thereof.

From the viewpoints of heat resistance and water resistance, the phenol-based curing agent and the naphthol-based curing agent are preferably a phenol-based curing agent having a novolac structure and a naphthol-based curing agent having a novolac structure, respectively. From the viewpoint of adhesion strength to a conductive layer, a nitrogen-containing phenol-based curing agent is preferable, and a triazine skeleton-containing phenol-based curing agent is more preferable. Among them, a triazine skeleton-containing phenol novolac resin is preferably used for a curing agent from the viewpoint of highly satisfying heat resistance, water resistance, and adhesion strength to a conductive layer.

Specific examples of the phenol-based curing agent and the naphthol-based curing agent may include "MEH-7700", "MEH-7810", and "MEH-7851" which are available from Meiwa Plastic Industries, Ltd., "NHN", "CBN", and "GPH" which are available from NIPPON KAYAKU Co., Ltd., "SN170", "SN180", "SN190", "SN475", "SN485", "SN495", "SN375", and "SN395" which are available from Tohto Kasei Co., Ltd., and "LA7052", "LA7054", "LA3018", and "LA1356" which are available from DIC Corporation.

From the viewpoint of enhancing the adhesion strength to a conductive layer, an active ester-based curing agent is also preferable. The active ester-based curing agent also has an effect of keeping low the roughness of a surface of an insulating layer after roughening treatment. Specifically, the active ester-based curing agent can provide an insulating layer having a surface with low roughness and high adhesion strength to a conductive layer. The active ester-based curing agent has an excellent effect as above, but also has a problem of resulting in the occurrence of a resin residue (smear) that is difficult to be removed in a desmear treatment. A relative intensive desmear treatment condition can be adopted to remove smear. However, in that case, the roughness of the surface of the insulating layer becomes high, resulting in that the excellent effect of the active ester-based curing agent itself is diminished.

Although details will be described below, the method for producing a printed wiring board of the present invention can enhance performance in removal of smear while maintaining low roughness of the surface of the insulating layer. Therefore, in the present invention, the excellent effect which is originally provided by the active ester-based curing agent can be advantageously maintained.

Although the active ester-based curing agent is not particularly limited, a compound having two or more highly reactive ester groups within the molecule is generally preferably used, such as phenol esters, thiophenol esters, N-hydroxyamine esters, and esters of heterocyclic hydroxy compounds. The active ester-based curing agent is preferably obtained by condensation reaction of a carboxylic acid compound and/or a thiocarboxylic acid compound with a hydroxy compound and/or a thiol compound. Particularly, from the viewpoint of enhancing the heat resistance, an active ester-based curing agent obtained from a carboxylic acid compound and a hydroxy compound is preferable, and an active ester-based curing agent obtained from a carboxylic acid compound and a phenol compound and/or a naphthol compound is more preferable. Examples of the carboxylic acid compound may include benzoic acid, acetic acid, succinic acid, maleic acid, itaconic acid, phthalic acid, isophthalic acid, terephthalic acid, and pyromellitic acid. Examples of the phenol compound or the naphthol compound may include hydroquinone, resorcinol, bisphenol A, bisphenol F, bisphenol S, phenolphthalin, methylated bisphenol A, methylated bisphenol F, methylated bisphenol S, phenol, o-cresol, m-cresol, p-cresol, catechol, .alpha.-naphthol, .beta.-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, dicyclopentadienyl diphenol, and phenol novolac.

The active ester-based curing agent is preferably an active ester compound containing a dicyclopentadienyl diphenol structure, an active ester compound containing a naphthalene structure, an active ester compound containing an acetylated material of phenol novolac, or an active ester compound containing a benzoylated material of phenol novolac. Among these, an active ester compound containing a napthalene structure or an active ester compound containing a dicyclopentadienyl diphenol structure is more preferable.

Examples of a commercially available products of the active ester-based curing agent may include "EXB9451", "EXB9460", "EXB9460S", and "HPC-8000-65T" (available from DIC Corporation) which are the active ester compound containing a dicyclopentadienyl diphenol structure, "EXB9416-70BK" (available from DIC Corporation) which is an active ester compound containing a naphthalene structure, "DC808" (available from Mitsubishi Chemical Corporation) which is an active ester compound containing an acetylated material of phenol novolac, and "YLH1026" (available from Mitsubishi Chemical Corporation) which is an active ester compound containing a benzoylated material of phenol novolac.

Specific examples of the benzoxazine-based curing agent may include "HFB2006M" available from Showa High Polymer Co., Ltd., and "P-d" and "F-a" which are available from Shikoku Chemicals Corporation.

Examples of the cyanate ester-based curing agent may include: a difunctional cyanate resin such as bisphenol A dicyanate, polyphenol cyanate (oligo(3-methylene-1,5-phenylenecyanate), 4,4'-methylenebis(2,6-dimethylphenyl cyanate), 4,4'-ethylidenediphenyl dicyanate, hexafluorobisphenol A dicyanate, 2,2-bis(4-cyanate)phenylpropane, 1,1-bis(4-cyanatephenylmethane), bis(4-cyanate-3,5-dimethylphenyl)methane, 1,3-bis(4-cyanatephenyl-1-(methylethylidene))benzene, bis(4-cyanatephenyl)thioether, and bis(4-cyanatephenyl)ether; a polyfunctional cyanate resin derived from phenol novolac, cresol novolac and so on; and a prepolymer in which these cyanate resins are partly triazinized. Specific examples of the cyanate ester-based curing agent may include "PT30" and "PT60" (both of which are a phenol novolac type polyfunctional cyanate ester resin) and "BA230" (a prepolymer in which bisphenol A dicyanate is partly or entirely triazinized to form a trimer) which are available from Lonza Japan Ltd.

The quantitative ratio of the epoxy resin to the curing agent, in terms of a ratio of (the total number of epoxy groups in the epoxy resin):(the total number of reactive groups in the curing agent), is preferably within a range of 1:0.2 to 1:2, more preferably within a range of 1:0.3 to 1:1.5, and still more preferably within a range of 1:0.4 to 1:1. The reactive group of the curing agent is an active hydroxyl group, an active ester group, or the like, and differs depending on the kind of the curing agent. The total number of epoxy groups in the epoxy resin is a value obtained by dividing the mass of solid content in each epoxy resin by respective epoxy equivalent weights and summing the calculated values for all epoxy resins. The total number of reactive groups in the curing agent is a value obtained by dividing the mass of solid content in each curing agent by respective reactive group equivalent weights and summing the calculated values for all curing agents. When the quantitative ratio of the epoxy resin to the curing agent falls within such a range, the heat resistance of the cured product of the resin composition would be improved.

As described above, from the viewpoint of obtaining an insulating layer having a surface with low roughness and high adhesion strength to a conductive layer, the curing agent preferably contains an active ester-based curing agent. The ratio of the active ester-based curing agent in the entire curing agent is preferably 10% or more, more preferably 30% or more, still more preferably 50% or more, and particularly preferably 60% or more, based on the number of reactive groups of the curing agent. The upper limit of the ratio is not particularly limited, and may be 100%. From the viewpoint of improving the curing reactivity, the ratio is preferably 90% or less, and more preferably 80% or less. When a mixture of an active ester-based curing agent and other curing agent is used as the curing agent, it is preferable that the other curing agent is a phenol-based curing agent or a naphthol-based curing agent from the viewpoint of achieving an insulating layer having a surface with low roughness and high adhesion strength to a conductive layer while obtaining a sufficient pot life of the composition.

(c) Inorganic Filler.

Examples of the inorganic filler may include silica, alumina, barium sulfate, talc, clay, a mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate. Among them, silica is particularly suitable, such as amorphous silica, fused silica, crystalline silica, synthetic silica, and hollow silica. Spherical silica is preferable as the silica. The inorganic filler may be used alone or in combination of two or more kinds thereof. Examples of commercially available spherical fused silica may include "SOC2" and "SOC 1" which are available from Admatechs Company Limited.

The average particle diameter of the inorganic filler is preferably within a range of 0.01 µm to 3 µm, more preferably within a range of 0.05 µm to 2 µm, still more preferably within a range of 0.1 µm to 1 µm, and particularly preferably within a range of 0.3 µm to 0.8 µm. The average particle diameter of the inorganic filler can be measured by a laser diffraction and scattering method on the basis of the Mie scattering theory. Specifically, the particle size distribution of the inorganic filler is prepared on the volume basis using laser diffraction and scattering particle size distribution measuring device, and the median diameter thereof can be measured as an average particle diameter. As a measurement sample, there can be preferably used a dispersion in which the inorganic filler is dispersed in water by ultrasonification. As the laser diffraction and scattering particle size distribution measuring device, LA-500 manufactured by Horiba, Ltd., or the like can be used.

To improve humidity resistance, the inorganic filler is preferably treated with one kind or two or more kinds of surface treatment agents such as an aminosilane-based coupling agent, an epoxysilane-based coupling agent, a mercaptosilane-based coupling agent, a silane-based coupling agent, an organosilazane compound, and a titanate-based coupling agent. Examples of a commercially available surface treatment agent may include "KBM403" (3-glycidoxypropyltrimethoxysilane) available from Shin-Etsu Chemical Co., Ltd., "KBM803" (3-mercaptopropyltrimethoxysilane) available from Shin-Etsu Chemical Co., Ltd., "KBE903" (3-aminopropyltriethoxysilane) available from Shin-Etsu Chemical Co., Ltd., "KBM573" (N-phenyl-3-aminopropyltrimethoxysilane) available from Shin-Etsu Chemical Co., Ltd., and "SZ-31" (hexamethyldisilazane) available from Shin-Etsu Chemical Co., Ltd.

With regard to the inorganic filler the surface of which is treated with the surface treatment agent, the amount of carbon per unit surface area of the inorganic filler can be measured after washing treatment with a solvent (for example, methyl ethyl ketone (MEK)). Specifically, a sufficient amount of MEK is added, as the solvent, to the inorganic filler the surface of which is treated with a surface treatment agent, and the resultant mixture is subjected to ultrasonic washing at 25° C. for 5 minutes. A supernatant liquid is removed and a solid content is dried. Thereafter, the amount of carbon per unit surface area of the inorganic filler can be measured with a carbon analyzer. As the carbon analyzer, "EMIA-320V" manufactured by Horiba, Ltd., or the like can be used.

From the viewpoint of improving the dispersibility of the inorganic filler, the amount of carbon per unit surface area of the inorganic filler is preferably 0.02 $mg/m^2$ or more, more preferably 0.1 $mg/m^2$ or more, and still more preferably 0.2 $mg/m^2$ or more. On the other hand, in terms of preventing an increase in the melt viscosity of a resin varnish and the melt viscosity in a sheet form, the amount of carbon per unit surface area of the inorganic filler is preferably 1 $mg/m^2$ or less, more preferably 0.8 $mg/m^2$ or less, and still more preferably 0.5 mg/m2 or less.

As described above, the present inventors have found that when an insulating layer is formed using a resin composition having a high content of an inorganic filler, the adhesion strength between the insulating layer and a conductive layer is likely to be reduced. However, the method for producing a printed wiring board of the present invention can achieve sufficient adhesion strength between the insulating layer and the conductive layer even when the resin composition having a high content of an inorganic filler is used.

From the viewpoint of preventing the occurrence of cracks and circuit distortions, which are caused by a difference of thermal expansion between the insulating layer and the conductive layer, by reducing the thermal expansion coefficient of the insulating layer, the content of the inorganic filler in the resin composition is preferably 40% by mass or more, more preferably 50% by mass or more, still more preferably 60% by mass or more, and particularly preferably 65% by mass or more.

In the method for producing a printed wiring board of the present invention, the content of the inorganic filler in the resin composition can be further increased without a reduction in the adhesion strength between the insulating layer and the conductive layer. For example, the content of the inorganic filler in the resin composition may be increased to 66% by mass or more, 68% by mass or more, 70% by mass or more, 72% by mass or more, or 74% by mass or more.

From the viewpoint of mechanical strength of the insulating layer, the upper limit of content of the inorganic filler is preferably 95% by mass or less, more preferably 90% by mass or less, and still more preferably 85% by mass or less.

In one embodiment, the resin composition used for the resin composition layer contains the epoxy resin (a), the curing agent (b), and the inorganic filler (c) as described above. In particular, the resin composition preferably contains a mixture of a liquid epoxy resin and a solid epoxy resin (the mass ratio of a liquid epoxy resin to a solid epoxy resin is preferably 1:0.1 to 1:5, more preferably 1:0.3 to 1:4.5, and still more preferably 1:0.6 to 1:4) as the epoxy resin (a); one or more selected from the group consisting of an active ester-based curing agent, a phenol-based curing agent, and a naphthol-based curing agent as the curing agent (b); and silica as the inorganic filler (c), respectively. From the viewpoint of more advantageously forming an insulating layer having a surface with low roughness and high adhesion strength to a conductive layer, the resin composition more preferably contains a mixture of a liquid epoxy resin and a solid epoxy resin (the mass ratio of a liquid epoxy resin to a solid epoxy resin is preferably 1:0.1 to 1:5, more preferably 1:0.3 to 1:4.5, and still more preferably 1:0.6 to 1:4) as the epoxy resin (a); a curing agent containing an active ester-based curing agent as the curing agent (b); and silica as the inorganic filler (c), respectively. With regard also to a resin composition layer containing a combination of such particular components, suitable contents of the epoxy resin (a), the curing agent (b), and the inorganic filler (c) therein are as described above. In particular, it is preferable that the content of the epoxy resin (a) is 3% by mass to 35% by mass and the content of the inorganic filler (c) is 40% by mass to 90% by mass, and it is more preferable that the content of the epoxy resin (a) is 5% by mass to 25% by mass and the content of the inorganic filler (c) is 50% by mass to 90% by mass. For the content of the curing agent (b), the curing agent (b) is preferably contained in the resin composition so that the ratio of the total number of epoxy groups in the epoxy resin (a) to the total number of reactive groups in the curing agent (b) is preferably 1:0.2 to 1:2, more preferably 1:0.3 to 1:1.5, and still more preferably 1:0.4 to 1:1.

The resin composition used for the resin composition layer may further contain an additive such as a thermoplastic resin, an accelerator, a flame retardant, and a rubber particle, if necessary.

Examples of the thermoplastic resin may include a phenoxy resin, a polyvinyl acetal resin, a polyimide resin, a polyamideimide resin, a polyethersulfone resin, and a polysulfone resin. The thermoplastic resin may be used alone or in combination of two or more kinds thereof.

The polystyrene equivalent weight average molecular weight of the thermoplastic resin is preferably within a range of 8,000 to 70,000, more preferably within a range of 10,000 to 60,000, and still more preferably within a range of 20,000 to 60,000. The polystyrene equivalent weight average molecular weight of the thermoplastic resin is measured by the gel permeation chromatography (GPC) method. Specifically, the polystyrene equivalent weight average molecular weight of the thermoplastic resin can be determined at a column temperature of 40° C. using LC-9A/RID-6A manufactured by Shimadzu Corporation as a measurement apparatus, Shodex K-800P/K-804L/K-804L manufactured by Showa Denko K.K. as columns, and chloroform or the like as a mobile phase, and carrying out calculation using a calibration curve of standard polystyrene.

Examples of the phenoxy resin may include phenoxy resins having one or more skeletons selected from the group consisting of a bisphenol A skeleton, a bisphenol F skeleton, a bisphenol S skeleton, a bisphenol acetophenone skeleton, a novolac skeleton, a biphenyl skeleton, a fluorene skeleton, a dicyclopentadiene skeleton, a norbornene skeleton, a naphthalene skeleton, an anthracene skeleton, an adamantane skeleton, a terpene skeleton, and a trimethyl cyclohexane skeleton. A terminal of phenoxy resin may be any functional group such as a phenolic hydroxyl group and an epoxy group. The phenoxy resin may be used alone or in combination of two or more kinds thereof. Specific examples of the phenoxy resin may include "1256" and "4250" (both of which are a bisphenol A skeleton-containing phenoxy resin), "YX8100" (a bisphenol S skeleton-containing phenoxy resin), and "YX6954" (a bisphenol acetophenone skeleton-containing phenoxy resin) which are available from Mitsubishi Chemical Corporation. Additional examples thereof may include "FX280" and "FX293" which are available from Tohto Kasei Co., Ltd., and "YL7553", "YL6794", "YL7213", "YL7290", and "YL7482" which are available from Mitsubishi Chemical Corporation.

Specific examples of the polyvinyl acetal resin may include denkabutyral 4000-2, 5000-A, 6000-C, and 6000-EP which are available from DENKI KAGAKU KOGYO KABUSHIKI KAISHA, and S-LEC BH series, BX series, KS series, BL series, and BM series which are available from SEKISUI CHEMICAL CO., LTD.

Specific examples of the polyimide resin may include "RIKACOAT SN20" and "RIKACOAT PN20" which are available from New Japan Chemical Co., Ltd. Additionally, specific examples of the polyimide resin may include modified polyimides such as a linear polyimide obtained by reaction of a difunctional hydroxyl-terminated polybutadiene, a diisocyanate compound and a tetrabasic acid anhydride (described in JP-A-2006-37083, which is incorporated herein by reference in its entirety), and a polysiloxane skeleton-containing polyimide (described in JP-A-2002-12667 and JP-A-2000-319386, both of which are incorporated herein by reference in their entireties).

Specific examples of the polyamideimide resin may include "VYLOMAX HR11NN" and "VYLOMAX HR16NN" which are available from TOYOBO CO., LTD. Additionally, specific examples of the polyamideimide resin may include modified polyamideimides such as polysiloxane skeleton-containing polyamideimide "KS9100" and "KS9300" which are available from Hitachi Chemical Company, Ltd.

Specific examples of the polyethersulfone resin may include "PES5003P" available from Sumitomo Chemical Co., Ltd.

Specific examples of the polysulfone resin may include polysulfones "P1700" and "P3500" which are available from Solvay Advanced Polymers K.K.

The content of the thermoplastic resin in the resin composition is preferably 0.1% by mass to 20% by mass. When the content of the thermoplastic resin falls within such a range, the viscosity of the resin composition is moderate, and therefore a resin composition having uniform thickness and bulk properties can be formed. The content of the thermoplastic resin in the resin composition is more preferably 0.5% by mass to 10% by mass.

Examples of the accelerator may include an organic phosphine compound, an imidazole compound, an amine adduct compound, and a tertiary amine compound. The accelerator is preferably used so that the content thereof falls within a range of 0.05% by mass to 3% by mass when total content of nonvolatile components in the epoxy resin (a) and the curing agent (b) is defined as 100% by mass. The accelerator may be used alone or in combination of two or more kinds thereof.

Examples of the flame retardant may include an organic phosphorus-based flame retardant, an organic nitrogen-containing phosphorus compound, a nitrogen compound, a silicone-based flame retardant, and a metal hydroxide. The flame retardant may be used alone or in combination of two or more kinds thereof. Although the content of the flame retardant in the resin composition is not particularly limited, it is preferably 0.5% by mass to 10% by mass, more preferably 1% by mass to 9% by mass, and still more preferably 1% by mass to 8% by mass.

The rubber particle which may be used in the present invention is, for example, one which is insoluble in a solvent described below and is incompatible with the above epoxy resin, curing agent and thermoplastic resin. In general, such a rubber particle can be prepared by increasing the molecular weight of a rubber component to such an extent that it is insoluble in the solvent and the resin, and converting it into a granular state.

Examples of the rubber particle may include a core-shell type rubber particle, a crosslinked acrylonitrile butadiene rubber particle, a crosslinked styrene butadiene rubber particle, and an acrylic rubber particle. The core-shell type rubber particle is a rubber particle having a core layer and a shell layer, and examples thereof may include a two-layer structure in which the shell layer as an external layer is made of a glassy polymer and the core layer as an internal layer is made of a rubbery polymer; and a three-layer structure in which the shell layer as an external layer is made of a glassy polymer, an intermediate layer is made of a rubbery polymer, and the core layer is made of a glassy polymer. The glassy polymer layer is made of, for example, a methyl methacrylate polymer, and the rubbery polymer layer is made of, for example, a butyl acrylate polymer (butyl rubber). The rubber particle may be used alone or in combination of two or more kinds thereof.

The average particle diameter of the rubber particle is preferably within a range of 0.005 µm to 1 µm and more preferably within a range of 0.2 µm to 0.6 µm. The average particle diameter of the rubber particles can be measured using a dynamic light scattering method. For example, the measurement can be carried out by uniformly dispersing the rubber particles in an appropriate organic solvent by ultrasonic wave or the like, preparing the particle size distribution of the rubber particle using a concentrated system particle size analyzer (FPAR-1000, manufactured by Otsuka Electronics Co., Ltd.) on the mass basis, and defining its median diameter as the average particle diameter. The content of the rubber particle in the resin composition is preferably 1% by mass to 10% by mass, and more preferably 2% by mass to 5% by mass.

The resin composition used for the resin composition layer may contain other additives, if necessary. Examples of the other additives may include an organometallic compound such as an organic copper compound, an organic zinc compound and an organic cobalt compound, and a resin additive such as an organic filler, a thickener, an antifoaming agent, a leveling agent, an adhesion-imparting agent, a coloring agent, and a curable resin.

The thickness of the resin composition layer is preferably 3 µm to 100 µm, more preferably 5 µm to 80 µm, and still more preferably 20 µm to 60 µm.

Hard Mask

In the present invention, the term "hard mask" refers to a layer which comprises a metal nitride. Preferably, the metal nitride is one or more selected from the group consisting of TiN, TaN, $Si_3N_4$, $W_3N_2$, Cu3N, AlN (aluminum nitride), BN (boron nitride) and mixtures thereof.

The hard mask may contain other components, such as Ti, Ta, or W. Typically, the hard mask will contain the metal nitride in an amount of 95 to 100 wt. %, preferably 98 to 100 wt. %, more preferably 99 to 100 wt. %, based on the total weigh of the hard mask.

The thickness of the hard mask typically will be 10 nm or more, 30 nm or more, 50 nm or more, or 100 nm or more. In addition the thickness typically will be 5 µm or less, 3 µm or less, or 1 µm or less depending on the dielectric thickness. The hard mask will have an etch selectivity compared to the dielectric materials and also to the resist that is used to pattern the size of the via to be transferred into the dielectric.

There are multiple methods that the hard mask will be formed on top of the resin film. One is by dry plating the surface of the resin film. Examples of the dry plating may include physical vapor deposition (PVD) such as vacuum deposition, sputtering, ion plating and laser ablation, and chemical vapor deposition (CVD) such as thermal CVD and plasma CVD. Among them, deposition and sputtering are preferable. Another way is that the hard mask is already deposited on the surface of the support or protective film during the making of the resin film with a support, then the resin film will be vacuum pressed on top of the hard mask to form the adhesive film that has the resin film and hard mask. The vacuum lamination can be carried out under the conditions as described below. The latter method will be cost effective and save the manufacturer the sputtering step before performing the lithography to pattern the via. The same materials of the protective film can be used as the support. In addition, the surface of a support to be in contact with hard mask may be subjected to a release treatment with a release agent such as silicone mold release, alkyd resin mold release, fluorine mold release, anti-tarnish agent, silane coupling agent and the like.

Protective Film

In some embodiments, the adhesive layer will further contain a cover or protective film or layer on the side of the resin film opposite that of the hard mask. Although the thickness of the protective film is not particularly limited, it is, for example, 1 µm to 40 µm. When the protective film is present, attachment of dust or the like or generation of scratches on the surface of the resin composition layer can be prevented. In the production of a printed wiring board, the adhesive sheet with a support can be used by peeling off the protective film. The protective or cover film will typically be an inert material such as polypropylene, nylon, polyethylene naphthalate, polyimide, polyamideimide, polyamide, polymethyl methacrylate, polyether sulfide, polyether ketone, polytetrafluoroethylene, polycarbonate or polyethylene terephthalate (PET). Among them, polyethylene terephthalate is preferable.

Laminating the Adhesive Film

In this embodiment, the adhesive film comprising a resin film and a hard mask is laminated on the substrate. The lamination of the adhesive film onto the substrate may be carried out by any conventionally known method. In particular, it is preferable that the adhesive film is laminated by a roll or press compression bonding so that the resin composition layer thereof is in contact with the internal layer circuit substrate. It is more preferable that the adhesive film is laminated by a vacuum lamination method in which the lamination is performed under reduced pressure. The lamination method may be a method of batch mode or of continuous mode.

In general, it is preferable that the lamination is carried out under the following condition: a compression bonding pressure within a range of 1 $kgf/cm^2$ to 11 $kgf/cm^2$ (0.098 MPa to 1.078 MPa); a compression bonding temperature within a range of 70° C. to 120° C.; a compression bonding time within a range of 5 seconds to 180 seconds; and under a reduced pressure at air pressure of 20 mmHg (26.7 hPa) or less.

The lamination can be performed using a commercially available vacuum laminator. Examples of the commercially available vacuum laminator may include a vacuum pressure laminator manufactured by Meiki Co., Ltd., and a vacuum applicator manufactured by Nichigo-Morton Co., Ltd.

Curing the Adhesive Film

The conditions for thermally curing the resin composition layer are not particularly limited, and conditions which are generally used in formation of an insulating layer of a printed wiring board may be used.

The condition for thermally curing the resin composition layer varies depending on the kinds or the like of the resin composition. For example, a curing temperature can be set within a range of 120° C. to 240° C. (preferably within a range of 150° C. to 210° C., and more preferably within a range of 170° C. to 190° C.) and a curing time can be set within a range of 5 minutes to 90 minutes (preferably within a range of 10 minutes to 75 minutes, and more preferably within a range of 15 minutes to 60 minutes).

Before thermally curing the resin composition layer, the resin composition layer may be preheated at a temperature lower than the curing temperature. For example, before thermally curing the resin composition layer, the resin composition layer may be preheated at a temperature of 50° C. or higher and lower than 120° C. (preferably 60° C. or higher and 110° C. or lower, and more preferably 70° C. or higher and 100° C. or lower) for 5 minutes or more (preferably 5 minutes to 150 minutes, and more preferably 15 minutes to 120 minutes).

Photo-Sensitive Material

The photo-sensitive resin composition used for the photo-sensitive material is not particularly limited. For example, a photo-sensitive resin composition containing (a) an epoxy resin, (b) an acid anhydride curing agent, (c) a photopolymerization initiator and (d) an inorganic filler can be used. The photo-sensitive resin composition may further contain an additive such as a reactive diluent, a curing accelerator, thermoplastic resin, a flame retardant, an organic filler, and organic solvent if necessary. In the present invention, the content of each component constituting the photo-sensitive resin composition is a value when the total content of nonvolatile components in the photo-sensitive resin composition is defined as 100% by mass (see WO2015-002071, WO2010-074197, WO2015-025925, etc., which are incorporated herein by reference in their entireties). As the photo-sensitive material, a commercially available product may be used in the present invention.

Once the dielectric material is covered by the hard mask, then the appropriate photoresist is chosen that will work best for the pattern formation and also provide some etch selectivity to the etching of the hard mask and this can be achieved either by the type of the photoresist polymer or slight increase of the photoresist thickness to allow the opening of the hard mask. This is called resist budgeting which means having enough resist thickness to allow the hard mask to open without any punch through before completion of the full hard mask opening for the specific via size. Photoresist types are abundant for this purpose and the choice is dependent on the user or manufacturer of the circuitry for the packaging industry. The definition or limitation of which resist to be used is not the intention of this disclosure and we are only indicating the flow of processes that will follow the formation of our invention of the type of hard mask to be used for the patterning of via using dry etch process.

Coating or Laminating the Photo-Sensitive Material

In this step, the photo-sensitive material is coated or laminated on the exposed surface of the hard mask. The photoresist that will be used can be in the form of dry film that will be laminated on top of the substrate that is different from rounded wafer. It can be also in the form of liquid and then it can be coated using spray or slit coating techniques. Such coating or laminating may be performed using a conventionally known method. The method of applying the resist will depend on the manufacturer/user of the dielectric material for their circuitry. These are only for indication only and are not meant to mention an exhaustive list of the different techniques used which is not the purpose of this invention.

Developing the Photo-Sensitive Material,

In this step, the photo-sensitive material is developed to form a pattern for at least one via. The development of the photo-sensitive material may be conducted by any appropriate method, such as spray/puddling or any other appropriate method that is defined and tested by the user/manufacturer. Such developing may be performed using a conventionally known method and the patterned resist can be formed.

Forming an Opening in the Hard Mask

In this step, one or more opening corresponding to the one or more via formed in the photo-sensitive material are formed in the hard mask by etching. Etching may be dry etching or wet etching, but from the view point of obtain via holes with small dimension size, it is preferably dry etching. Although the dry etching method is not particularly limited, from the view point of obtain via holes with <10 μm dimension size, it is preferred that the opening be carried out with the dry reactive ion etch ("RIE") method. In this case, the equipment and conditions may be performed using a conventionally known method.

Forming a Via in the Dielectric

In this step, one or more via corresponding to the one or more via formed in the photo-sensitive material are formed in the dielectric by dry etching. Although the dry etching method is not particularly limited, it is preferably the RIE method. In this case, the equipment and conditions are essentially the same as described above.

Removing the Photo-Sensitive Material.

In this step, the remaining photo-sensitive material is removed using dry etch process or can be also stripped using an organic solvent. It may be performed using a conventionally known method.

Sputtering a Seed Layer and Forming a Wiring Pattern

In this step, a plating seed layer is formed on the surface of the insulating layer by sputtering. A photo resist material is also laminated or coated the substrate to be used to form the traces/wiring of the specific layer on the device. Subsequently, on the formed resist layer on top of the seed layer, a mask pattern is formed that exposes the resist layer corresponding to desired wiring pattern. A metal layer is formed on the exposed plating seed layer by electrolytic plating, and then the resist layer is removed. Electroless plating may be used if it is cost effective. After that, an unnecessary plating seed layer and remaining hard mask can be removed by etching or the like to form a conductive layer having desired wiring pattern. Such wiring pattern may be performed using a conventionally known semi-additive process (SAP) method.

Desmearing

In some embodiments, it might be preferable to perform a desmearing step after the formation of the via in the dielectric. The desmearing may be carried out in a conventional manner is described in U.S. Pat. No. 8,382,996, which is incorporated herein by reference in its entirety. Thus, such desmearing step can be performed by a known method such as a dry process of plasma and the like, a wet process by an oxidant treatment using an alkaline permanganate solution and the like, and the like. The desmearing step mainly removes wall surface residues produced by formation of a through hole, and aims to roughen the wall surfaces. Particularly, desmearing with an oxidant is preferable since the residue is removed while simultaneously roughening the via wall surfaces with an oxidant, thus improving the plating adhesion strength. When a through hole is formed from the surface of a support layer, the desmearing step can be performed before or after detachment of the support layer. Particularly, it is preferably performed after detachment of the support layer (when a release layer remains, after removal of the release layer). As mentioned above, to prevent the surface of the insulating layer from being roughened, the desmearing step is more preferably performed before (C) a step of removing the metal film layer. A desmearing step with an oxidant preferably includes a swelling treatment with a swelling solution, a roughening treatment with an oxidant and a neutralization treatment with a neutralizing solution in this order. While the swelling solution is not particularly limited, an alkaline solution, surfactant solution, and the like can be mentioned, with preference given to an alkaline solution. As the alkaline solution, sodium hydroxide solution and potassium hydroxide solution are more preferable. Examples of the commercially available swelling solution include Swelling Dip Securiganth P and Swelling Dip Securiganth SBU manufactured by ATOTECH Japan K.K. and the like. While the swelling treatment with a swelling solution is not particularly limited, specifically, a swelling solution at 30 to 90° C. is applied for 1 minute to 15% minutes. In view of workability and prevention of excess swelling of a resin, a method of immersing in a swelling solution at 40 to 80° C. for 5 seconds to 10 minutes is preferable. While the oxidant is not particularly limited, for example, an alkaline permanganate solution obtained by dissolving potassium permanganate or sodium permanganate in an aqueous sodium hydroxide solution can be mentioned. A roughening treatment with an oxidant such as alkaline permanganate solution and the like is preferably performed by immersing in an oxidant solution heated to 60° C. to 80° C. for 10 minutes to 30 minutes. The concentration of permanganate in the alkaline permanganate solution is preferably 5 to 10 wt %. Examples of the commercially available oxidant include alkaline permanganate solutions such as Concentrate Compact CP, and Dosing Solution Securiganth P manufactured by ATOTECH Japan K.K., and the like. As the neutralizing solution, an acidic aqueous solution is preferable, and as commercially available products, Reduction Solution Securiganth P (neutralizing solution) manufactured by ATOTECH Japan K.K. can be mentioned. For a treatment with a neutralizing solution, a method including application of a neutralizing solution at 30 to 80° C. for 5 minutes to 30 minutes to a surface after a roughening treatment with an oxidant solution can be used. In view of workability and the like, a method including application of a neutralizing solution at 40 to 70° C. for 5 minutes to 20 minutes to an object after a roughening treatment with an oxidant solution is preferable.

In a second embodiment, the present invention provides a method for producing a circuit board, comprising:
(a) laminating an adhesive film, which comprises a resin, on a substrate, curing said resin to form a dielectric, and sputtering a hard mask on said dielectric;
(b) coating or laminating a photo-sensitive material on said hard mask and developing said photo-sensitive material, to form a pattern of one or more via;
(c) forming one or more openings in said hard mask corresponding to said one or more via in said photo-sensitive material with dry etching;
(d) forming one or more via in said dielectric corresponding to said one or more via in said photo-sensitive material with dry etching;
wherein the hard mask comprises a metal nitride.

In this second embodiment, the materials and steps are the same as those described above in the first embodiment, with the exception that the resin is first laminated on the substrate and cured to form the dielectric prior to sputtering the hard mask on the dielectric.

The sputtering of the hard mask on the dielectric may be carried out by sputtering tools known in the industry such as E-400S manufactured by Canon ANELVA Corporation, devices manufactured by Evatec, and devices manufactured by ASM Nexx (see, e.g., U.S. Pat. No. 8,584,352, which is incorporated herein by reference in its entirety).

In a third embodiment, the present invention provides a method of producing a circuit board, comprising:
(a) laminating an adhesive film, comprising a resin, on a substrate, laminating a hard mask on said adhesive film, and curing said resin to obtain a dielectric;
(b) coating or laminating a photo-sensitive material on said hard mask and developing said photo-sensitive material, to form a pattern of one or more via;
(c) forming one or more openings in said hard mask corresponding to said one or more via in said photo-sensitive material with dry etching;
(d) forming one or more via in said dielectric corresponding to said one or more via in said photo-sensitive material with dry etching;
wherein the hard mask comprises a metal nitride.

In this third embodiment, the materials and steps are the same as those described above in the first embodiment, with the exception that the resin is first laminated on the substrate, the hard mask is then laminated on the adhesive film, and then the resin is cured to form a dielectric.

The laminating of the hard mask on the adhesive sheet may be carried out by a laminating machine and so on. For lamination of an hard mask with a support on an adhesive film, the hard mask is preferably laminated on the surface of the adhesive film by roll-bonding, press-bonding and the like, in view of workability and available uniform contact state. Particularly, lamination under reduced pressure by vacuum lamination method is preferable. In addition, the lamination method may be of a batch type or a continuous type with a roll. The lamination conditions are the same as described above. The vacuum lamination can be performed using a commercially available vacuum laminating machine. Examples of the commercially available vacuum laminating machine include a batch type vacuum pressurization laminating machine MVLP-500 manufactured by MEIKI CO., LTD., a vacuum applicator manufactured by Nichigo-Morton Co., Ltd., a vacuum pressurization laminating machine manufactured by MEIKI CO., LTD., a roll-type dry coater Manufactured by Hitachi Industries Co., Ltd., a vacuum laminating machine manufactured by Hitachi AIC Inc. and the like.

In a fourth embodiment, the present invention provides an adhesive sheet, comprising a cover film, a resin composition layer, and a hard mask in this order;
wherein said hard mask comprises a metal nitride.

In this fourth embodiment, the various materials are the same as those described above in the first embodiment. Moreover, the adhesive sheet may be prepared using the method described above in the context of the first embodiment.

Other features of the invention will become apparent in the course of the following descriptions of exemplary embodiments which are given for illustration of the invention and are not intended to be limiting thereof.

EXAMPLES

In the following examples, "parts" and "%" represent "parts by mass" and "% by mass" respectively, unless otherwise specified. Examples 1-8 correspond to the embodiment shown in FIG. 2, Example 9 corresponds to the embodiment shown in FIG. 1, and Example 10 corresponds to the embodiment shown in FIG. 3.

Preparation of Resin Varnish 10 parts of bisphenol A type epoxy resin (Mitsubishi Chemical "828US", epoxy equivalent: about 180), 20 parts of biphenyl type epoxy resin (Mitsubishi Chemical "YX4000HK", epoxy equivalent: about 190), 10 parts of biphenyl type epoxy resin (Nippon Kayaku "NC3000L", epoxy equivalent: about 269), 2 parts of phosphazene resin (Otsuka Chemical Co., Ltd. "SPS-100"), and 10 parts of phenoxy resin (YX7553BH30 manufactured by Mitsubishi Chemical Corporation, 1:1 solution of MEK and cyclohexanone with 30% solid content) are dissolved by heating in 60 parts of MEK and 20 parts of toluene with stirring. After cooling to room temperature, 30 parts of active ester-based curing agent (HPC-8000-65T manufactured by DIC, active group equivalent: about 223, toluene solution with solid content of 65% by mass), 8 parts of phenolic-based curing agent ("LA-3018-50P" manufactured by DIC, phenolic group equivalent: about 151, 2-metoxypropanol solution with solid content of 50% by mass), 6 parts of benzoxazine compound (JFE Chemical "ODA-BOZ", MEK solution with solid content of 50% by mass), 4 parts of curing accelerator (4-dimethyl aminopyridine (DMAP), MEK solution with solid content of 5% by mass), and 110 parts of spherical silica (Denka "UFP-30", average particle size 0.3 μm, specific surface area 3.09 m$^2$) are mixed thereto. The mixture is uniformly dispersed with a high-speed rotary mixer, and then is filtered through a cartridge filter (ROKITECHNO "SHP020"), thus a resin varnish is prepared.

Preparation of Resin Sheet

Sheet 1

A PET film ("AL5" manufactured by Lintec Co., Ltd.) with a thickness of 38 μm is prepared as a support. The resin varnish is uniformly applied on the support with a die coater, and is dried at 80-120° C. (100° C. on average) for 3 minutes to form a resin layer (thickness 3 μm). Thereafter, the smooth surface side of a polypropylene cover film (Oji F-Tex "Alfan MA-411") with a thickness of 15 μm is stuck on the resin surface, thus "the support/resin layer/the cover film" is produced.

Sheet 2

A PET film ("AL5" manufactured by Lintec Co., Ltd.) with a thickness of 38 μm is prepared as a support. The resin varnish is uniformly applied on the support with a die coater, and is dried at 80-120° C. (100° C. on average) for 3 minutes to form a resin layer (thickness 3 μm). A release layer is formed by the Hypromellose Phthalate (Shinetsu "HP-55", toluene/ethanol is 1/1 solution with solid content of 15% by mass) on one side of another PET film. 1 μm thick TiN is formed by sputtering method on the release layer. Thereafter, the TiN layer is stuck on the resin surface, thus "the support/release layer/TiN/resin layer/the support" is produced.

Example 1

Preparation of Substrate for Evaluation (1) Preparation of Internal Layer Circuit Substrate As the internal layer circuit substrate, a silicon wafer (300 mm size) with a circuit is prepared.

(2) Lamination of Resin Sheet

The cover film is peeled off from the resin sheet produced as described above (Sheet 1). The resin sheet is laminated onto the internal layer circuit substrate using a batch type vacuum pressurized laminator (a two-stage build-up laminator "CVP700" manufactured by Nichigo-Moton), so that the resin layer is in contact with the internal layer circuit substrate. The lamination is carried out by the pressure for 30 seconds to an air pressure of 13 hPa or less and then performing a lamination treatment for 30 seconds at 100° C. under a pressure of 0.74 MPa.

(3) Curing of Resin Layer

The laminated resin sheet with a support is heated at 130° C. for 30 minutes and then at 175° C. for 30 minutes, whereby the resin layer is thermally cured to form an insulating layer. The substrate for evaluation is prepared.

Processing of Substrate for Evaluation (1) Formation of Hard Mask

The support is removed and 1 μm thick TiN is formed by sputtering method on the insulating layer of the substrate for evaluation.

(2) Opening of Hard Mask

A photosensitive resist film of predetermined thickness is formed on the TiN, and a circular pattern of 5 μm is formed through exposure and development process. The TiN is perforated from the patterned resist film side using the Reactive Ion Etching (RIE) process. At this time, the TiN is removed using gas containing $BCl_3$.

(3) Formation of Via Hole

The insulating layer is perforated from the patterned TiN side using the Reactive Ion Etching (RIE) process. At this time, the insulating layer is removed using gas containing $O_2$ and $CF_4$. Then the resist layer is removed from the substrate.

Example 2

Except for replacing the TiN with TaN, a via hole is produced in the same manner as in Example 1.

Example 3

Except for replacing the 1 μm thick TiN with 3 μm thick TiN, a via hole is produced in the same manner as in Example 1.

Example 4

Except for replacing the 1 μm thick TiN with 5 μm thick TiN, a via hole is produced in the same manner as in Example 1.

Example 5

Except for replacing the 1 μm thick TiN with 0.02 μm thick TiN, a via hole is produced in the same manner as in Example 1.

Example 6

Except for using Direct Plasma (DP) instead of RIE in the process of formation of via hole, a via hole is produced in the same manner as in Example 1.

Example 7

Except for removing the resist between the opening of the hard mask and the process of formation of the via hole, a via hole is produced in the same manner as in Example 1.

Example 8

Except for removing the TiN using an acidic chemical solution instead of RIE in the process of opening of the hard mask, a via hole is produced in the same manner as in Example 1.

Comparative Example 1

Except for replacing the TiN with Ti, a via hole is produced in the same manner as in Example 1.

Example 9

Preparation of Substrate for Evaluation
(1) Preparation of Internal Layer Circuit Substrate As the internal layer circuit substrate, a silicon wafer (300 mm size) with a circuit is prepared.
(2) Lamination of Resin Sheet The PET film on the resin layer is peeled off from the resin sheet produced as described above (Sheet 2). The resin sheet is laminated onto the internal layer circuit substrate using a batch type vacuum pressurized laminator (a two-stage build-up laminator "CVP700" manufactured by Nichigo-Moton), so that the resin layer is in contact with the internal layer circuit substrate. The lamination is carried out by the same conditions set forth above.
(3) Curing of Resin Layer The laminated resin sheet with a support is heated at 130° C. for 30 minutes and then at 175° C. for 30 minutes, whereby the resin layer is thermally cured to form an insulating layer. The substrate for evaluation is prepared.
Processing of Substrate for Evaluation
(1) Formation of Hard Mask The PET film on the TiN layer is peeled off, and the release layer is removed by alkaline aqueous solution.
(2) Opening of Hard Mask A photosensitive resist film of predetermined thickness is formed on the TiN, and a circular pattern of 5 μm is formed through exposure and development process. The TiN is perforated from the patterned resist film side using the Reactive Ion Etching (RIE) process. At this time, the TiN is removed using gas containing $BCl_3$.
(3) Formation of Via Hole The insulating layer is perforated from the patterned TiN side using the Reactive Ion Etching (RIE) process. At this time, the insulating layer is removed using gas containing $O_2$ and $CF_4$. Then the resist layer is removed from the substrate.

Example 10

Preparation of Substrate for Evaluation
(1) Preparation of Internal Layer Circuit Substrate As the internal layer circuit substrate, a silicon wafer (300 mm size) with a circuit is prepared.
(2) Lamination of Resin Sheet The cover film is peeled off from the resin sheet produced as described above (Sheet 1). The resin sheet is laminated onto the internal layer circuit substrate using a batch type vacuum pressurized laminator (a two-stage build-up laminator "CVP700" manufactured by Nichigo-Moton), so that the resin layer is in contact with the internal layer circuit substrate. The lamination is carried out by the same conditions set forth above.
(3) Lamination of TiN Layer A release layer is formed by the Hypromellose Phthalate (Shinetsu "HP-55", toluene/ethanol is 1/1 solution with solid content of 15% by mass) on one side of the PET film. 1 μm thick TiN is formed by sputtering method on the release layer. The TiN layer is laminated on the resin layer using the batch type vacuum pressurized laminator with the above condition.
(4) Curing of Resin Layer The laminated resin sheet with a support is heated at 130° C. for 30 minutes and then at 175° C. for 30 minutes, whereby the resin layer is thermally cured to form an insulating layer. The substrate for evaluation is prepared.
Processing of Substrate for Evaluation
(1) Formation of Hard Mask The PET film on the TiN layer is peeled off, and the release layer is removed by alkaline aqueous solution.
(2) Opening of Hard Mask A photosensitive resist film of predetermined thickness is formed on the TiN, and a circular pattern of 5 μm is formed through exposure and development process. The TiN is perforated from the patterned resist film side using the Reactive Ion Etching (RIE) process. At this time, the TiN is removed using gas containing $BCl_3$.
(3) Formation of Via Hole The insulating layer is perforated from the patterned TiN side using the Reactive Ion Etching (RIE) process. At this time, the insulating layer is removed using gas containing $O_2$ and $CF_4$. Then the resist layer is removed from the substrate.
Evaluation
Hard Mask Opening The opening diameter of the hard mask is evaluated by SEM.
Evaluation Criteria
   A: Mask opening diameter is less than 6 μm
   B: Mask opening diameter is 6 μm or more and less than 10 μm
   C: Mask opening diameter is 10 μm or more
Via Hole Opening The top diameter of the via hole is evaluated by SEM.
Evaluation Criteria
   A: The top of the via hole is less than 6 μm
   B: The top of the via hole is 6 μm or more and less than 10 μm
   C: The top of the via hole is 10 μm or more The materials and conditions used in the Examples are summarized in the following table.

| | | Ex1 | Ex2 | Ex3 | Ex4 | Ex 5 | Ex6 | Ex7 | Ex8 | Ex9 | Ex10 | Com Ex1 |
|---|---|---|---|---|---|---|---|---|---|---|---|---|
| Resin layer | Thickness (um) | 3 | 3 | 3 | 3 | 3 | 3 | 3 | 3 | 3 | 3 | 3 |
| Hard mask | Type of metal | TiN | TaN | TiN | TiN | TiN | TiN | TiN | TiN | TiN | TiN | Ti |
| | Target Mask diameter (um) | 5 | 5 | 5 | 5 | 5 | 5 | 5 | 5 | 5 | 5 | 5 |
| | Thickness (um) | 1 | 1 | 3 | 5 | 0.02 | 1 | 1 | 1 | 1 | 1 | 1 |
| | Method for mask opening | RIE | RIE | RIE | RIE | RIE | RIE | RIE | Wet etching | RIE | RIE | RIE |

-continued

|  |  | Ex1 | Ex2 | Ex3 | Ex4 | Ex 5 | Ex6 | Ex7 | Ex8 | Ex9 | Ex10 | Com Ex1 |
|---|---|---|---|---|---|---|---|---|---|---|---|---|
| Via formation | Mode | RIE | RIE | RIE | RIE | RIE | DP | RIE | RIE | RIE | RIE | RIE |
|  | Photo resist | w/ | w/ | w/ | w/ | w/ | w/ | w/o | w/ | w/ | w/ | w/ |
| Process | Fig | 2 | 2 | 2 | 2 | 2 | 2 | 2 | 2 | 1 | 3 | — |

Industrial Applicability

The present invention provides a process for forming printed wiring boards containing fine via by using RIE. The metal nitride hard mask will protect the surface of the dielectric from being exposed to RIE ion bombardment during the full etch process and transfer of the via pattern into the dielectric. Therefore, after the pattern transfer of the via into the dielectric and stripping the remaining layer of the resist (photo-sensitive material) and nitride hard mask, the top surface of the dielectric will be fully intact and undamaged.

Where a numerical limit or range is stated herein, the endpoints are included. Also, all values and subranges within a numerical limit or range are specifically included as if explicitly written out.

As used herein the words "a" and "an" and the like carry the meaning of "one or more."

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A method of producing a circuit board, comprising:
   (a) laminating an adhesive film, which comprises a resin film and a hard mask, on a substrate such that said resin film is in direct contact with said substrate, and curing said adhesive film to obtain a dielectric which is in direct contact with said substrate;
   (b) coating or laminating a photo-sensitive material on said hard mask and developing said photo-sensitive material, to form a pattern of one or more via;
   (c) forming one or more openings in said hard mask corresponding to said one or more via in said photo-sensitive material with dry etching; and
   (d) forming one or more via in said dielectric corresponding to said one or more via in said photosensitive material by dry etching;
   wherein said hard mask comprises TiN,
   wherein said hard mask has a thickness of 1 µm to 5 µm,
   wherein said one or more via in said dielectric have top diameters of less than 6 µm,
   wherein said resin film comprises at least one epoxy resin.

2. The method according claim 1, wherein said hard mask further comprises at least one metal nitride selected from the group consisting of TaN, $Si_3N_4$, $W_3N_2$, $Cu_3N$, AlN (aluminum nitride), BN (boron nitride), and mixtures thereof.

3. The method according to claim 1, wherein said hard mask has a thickness of 1 µm to 3 µm.

4. The method according to claim 1, wherein said dry etching of (d) process is carried out by reactive ion etching.

5. The method according to claim 1, further comprising:
   (e) removing said photo-sensitive material.

6. The method according to claim 1, further comprising:
   (f) sputtering a seed layer.

7. The method according to claim 1, wherein said resin film does not comprise polyimide resin.

8. The method according to claim 7, wherein said at least one epoxy resin comprises phenoxy resin.

9. A method of producing a circuit board, comprising:
   (a) laminating an adhesive film, which comprises a resin, on a substrate, curing said resin to form a dielectric, and sputtering a hard mask on said dielectric;
   (b) coating or laminating a photo-sensitive material on said hard mask and developing said photo-sensitive material, to form a pattern of one or more via;
   (c) forming one or more openings in said hard mask corresponding to said one or more via in said photo-sensitive material with dry etching;
   (d) forming one or more via in said dielectric corresponding to said one or more via in said photo-sensitive material with dry etching;
   wherein during the laminating said resin is in direct contact with said substrate,
   wherein after the curing said dielectric is in direct contact with said substrate,
   wherein said resin comprises at least one epoxy resin,
   wherein said hard mask comprises TiN,
   wherein said hard mask has a thickness of 1 µm to 5 µm, and
   wherein said one or more via in said dielectric have top diameters of less than 6 µm.

10. The method according claim 9, wherein said hard mask further comprises at least one metal nitride selected from the group consisting of TaN, $Si_3N_4$, $W_3N_2$, $Cu_3N$, AlN (aluminum nitride), BN (boron nitride), and mixtures thereof.

11. The method according to claim 1, wherein said hard mask has a thickness of 1 µm to 3 µm.

12. The method according to claim 9, wherein said dry etching of (d) process is carried out by reactive ion etching.

13. The method according to claim 9, further comprising:
   (e) removing said photo-sensitive material.

14. The method according to 9, further comprising:
   (f) sputtering a seed layer.

15. The method according to claim 9, wherein said resin film does not comprise polyimide resin.

16. The method according to claim 15, wherein said at least one epoxy resin comprises phenoxy resin.

17. A method of producing a circuit board, comprising:
   (a) laminating an adhesive film, comprising a resin, directly on a substrate, laminating a hard mask on said adhesive film, and curing said resin to obtain a dielectric in direct contact with said substrate;
   (b) coating or laminating a photo-sensitive material on said hard mask and developing said photo-sensitive material, to form a pattern of one or more via;
   (c) forming one or more openings in said hard mask corresponding to said one or more via in said photo-sensitive material with dry etching;

(d) forming one or more via in said dielectric corresponding to said one or more via in said photo-sensitive material with dry etching;
wherein said resin comprises at least one epoxy resin,
wherein said hard mask comprises TiN,
wherein said hard mask has a thickness of 1 μm to 5 μm,
wherein said one or more via in said dielectric have top diameters of less than 6 μm.

18. The method according claim 17, wherein said hard mask further comprises at least one metal nitride selected from the group consisting of TaN, $Si_3N_4$, $W_3N_2$, $Cu_3N$, AlN (aluminum nitride), BN (boron nitride) and mixtures thereof.

19. The method according to claim 1, wherein said hard mask has a thickness of 1 μm to 3 μm.

20. The method according to claim 17, wherein said dry etching of (d) process is carried out by reactive ion etching.

21. The method according to claim 17, further comprising:
(e) removing said photo-sensitive material.

22. The method according to claim 17, further comprising:
(f) sputtering a seed layer.

23. The method according to claim 17, wherein said resin film does not comprise polyimide resin.

24. The method according to claim 23, wherein said at least one epoxy resin comprises phenoxy resin.

* * * * *